United States Patent [19]

Ogami et al.

[11] Patent Number: 4,693,211
[45] Date of Patent: Sep. 15, 1987

[54] SURFACE TREATMENT APPARATUS

[75] Inventors: Nobutoshi Ogami; Masaru Kitagawa, both of Shiga, Japan

[73] Assignee: Dainippon Screen Mfg. Co., Ltd., Kyoto, Japan

[21] Appl. No.: 810,425

[22] Filed: Dec. 18, 1985

[30] Foreign Application Priority Data

Jan. 10, 1985 [JP] Japan ................. 60-950[U]

[51] Int. Cl.⁴ ............................................. C23C 16/00
[52] U.S. Cl. .................. 118/725; 118/500; 118/728
[58] Field of Search ............... 118/728, 725, 500, 715, 118/724

[56] References Cited

U.S. PATENT DOCUMENTS 3,785,853  1/1974  Kirkman .................. 118/725
4,581,248  4/1986  Roche ...................... 118/725

FOREIGN PATENT DOCUMENTS 60-92618  5/1985  Japan ...................... 118/728

Primary Examiner—John H. Newsome
Attorney, Agent, or Firm—Rosen, Dainow & Jacobs

[57] ABSTRACT

A surface treatment apparatus is composed of a supporting die for holding a substrate thereon to heat or cool the substrate; a cover capable of advancing close to the supporting die or into point-to-point contact with the supporting die to define a treatment space over the entire upper surface of the substrate on the supporting die, said cover defining a hole for the introduction of a surface treatment agent into the treatment space; and an evacuation chamber provided on the peripheral side wall of the supporting die, whereby the surface treatment agent is allowed to flow out from the treatment space into the evacuation chamber. No substantial conduction of heat takes place from the supporting die by way of the cover. The thermal distribution of the supporting die is thus kept extremely uniform, whereby each surface treatment can be conducted uniformly. Furthermore, owing to the provision of the evacuation chamber around the supporting die, the vaporized surface treatment agent is not allowed to escape into the room. The apparatus is effective in applying an adhesion-enhancing agent to a substrate so that the adhesion of a photoresist to the substrate is facilitated.

11 Claims, 3 Drawing Figures

SURFACE TREATMENT APPARATUS

BACKGROUND OF THE INVENTION (1). Field of the Invention

This invention relates to an apparatus for treating the surface of a thin planar substrate such as semiconductor substrate with a vaporized surface treatment agent. More specifically, this invention relates to an apparatus for treating the surface of a substrate with an adhesion-enhancing agent such as organochlorosilane or hexamethyldisilazane in order to improve the adhesion of a photoresist thereto.

(2). Description of the Prior Art

In order to avoid poor adhesion of a photoresist to the surface of an oxide material such as silicon dioxide substrate and hence to prevent possible undercutting of the oxide material upon etching, the surface of the oxide material is treated, for example, with an adhesion-enhancing agent containing a hexaalkyldisilazane as disclosed in Japanese Patent Publication No. 26043/1972. Upon effecting the surface treatment, the application of the adhesion-enhancing agent to surface of the substrate is conducted, for example, by the spraying method or the spinning method, by dipping the substrate in a solution of the adhesion-enhancing agent, or by placing the substrate in an atmosphere of the adhesion-enhancing agent in a vaporized state.

On the other hand, as disclosed in Japanese Patent Laid-Open No. 31151/1982, there is also known an apparatus for causing a number of semiconductor substrates to pass continuously through a bathing apparatus which contains a vaporized surface improver such as organochlorosilane or hexamethyldisilazane.

As illustrated in FIG. 3 of the accompanying drawings, another apparatus is also known to apply a surface treatment agent to substrates. In FIG. 3, a closed chamber 6 is formed surrounding a substrate 1 supported on a supporting die 2 by means of a cover 3 equipped with a feed pipe 4 for a vaporized surface treatment agent. The vaporized surface treatment agent is fed through the feed pipe 4 into the closed chamber 6. Numeral 3' indicates a packing.

Incidentally, the present assignee has already filed an application for the registration of a utility model on a drying and treatment apparatus similar to the apparatus depicted in FIG. 3, to which Japanese Utility Model Application No. 198947/198947 has been allotted.

Turning back to the conventional apparatus shown in FIG. 3, the supporting die 2 includes unillustrated heating or cooling means and a temperature sensor, which are both housed within the supporting die 2, and also defines vacuum suction holes 5 bored therethrough.

The substrate 1 is mounted on the supporting die 2. While sucking the substrate 1 under vacuum and hence holding it firmly on the upper surface of the supporting die 2, a vaporized surface treatment agent is fed into the closed chamber 6 to treat the surface of the substrate 1 with the surface treatment agent. The conventional apparatus is however accompanied by a problem that the vaporized surface treatment agent, which has been supplied through the feed pipe 4 into the closed chamber 6, is not allowed to adhere uniformly on the surface of the substrate 1.

It also includes another drawback that when an upper cover 3 is kept in contact with the supporting die 2 along the entire periphery of the upper cover 3, conduction of heat takes place at the contacted area and the surface temperature of the supporting die 2 is rendered different from one point to another.

In the conventional apparatus depicted in FIG. 3, the surface treatment agent may be fed into the chamber 6 through the left side wall of the cover 3 and may then be discharged through the right side wall of the cover 3 as viewed on the drawing. Even if the surface treatment agent is fed in the above-described manner, it is either impossible or extremely difficult to achieve uniform adhesion or deposition of the surface treatment agent.

SUMMARY OF THE INVENTION

An object of this invention is to make an improvement to such a conventional apparatus as shown in FIG. 3 and hence to provide an apparatus for applying a vaporized surface treatment agent uniformly onto a substrate supported on a supporting die.

In one aspect of this invention, there is thus provided a surface treatment apparatus comprising: a supporting die for holding a substrate, which is to be treated, on the upper surface thereof to heat or cool the substrate;

a cover capable of advancing close to the supporting die or into point-to-point contact with the supporting die to define a treatment space over the entire upper surface of the substrate on the supporting die, said cover defining a hole therethrough for the introduction of a surface treatment agent into the treatment space; and an evacuation chamber provided on the peripheral side wall of the supporting die, whereby the surface treatment agent is allowed to flow from the treatment space into the evacuation chamber.

In the surface treatment apparatus of this invention, the cover and supporting die are not brought into close contact to each other or their mutual contact is limited to point-to-point contact. Therefore, no substantial conduction of heat takes place from the supporting die by way of the cover. The thermal distribution of the supporting die is thus kept extremely uniform compared with the conventional supporting die, whereby each surface treatment can be conducted uniformly under prescribed temperature conditions. Furthermore, owing to the provision of the evacuation chamber around the supporting die, the vaporized surface treatment agent is not allowed to escape into the room. This is certainly convenient.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENT

Figure 3:
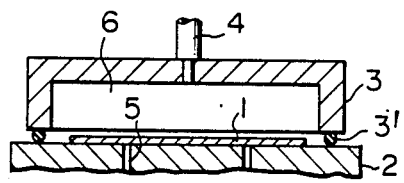
FIG. 3 is a schematic vertical cross-sectional view of an illustrative prior art surface treatment apparatus.

The present invention relates to an improvement to such a conventional apparatus as depicted in FIG. 3. The lower peripheral edge of the cover which is equipped with the hole for feeding the surface treatment agent therethrough is caused to advance close to the supporting die without bringing it into close contact with the supporting die along the entire periphery thereof or is caused to undergo mutual contact with supporting die at one to a few points. Thus, the cover and supporting die defines a chamber which is kept open along the clearance between the peripheral lower edge of the cover and the supporting die. Accordingly, the vaporized surface treatment agent which has been fed through the cover at a suitable point is allowed to flow out of the chamber through the opening between the peripheral lower edge of the cover and the supporting die.

Owing to the provision of the evacuation chamber on the side wall of the supporting die, the vaporized surface treatment agent which has flown out through the clearance between the cover and the supporting die is collected in the evacuation chamber and then evacuated through the evacuation chamber.

Incidentally, the evacuation chamber may preferably be provided with forced evacuation means so that the evacuation chamber serves to evacuate not only the vaporized surface treatment agent from the treatment chamber defined by the cover and supporting die but also air from the room in which the apparatus is installed. Care must however be taken to keep the treatment chamber out of direct influence of the forced evacuation means.

It is also preferable to arrange a straightening plate within the cover so that the vaporized surface treatment agent can be applied uniformly onto the surface of the substrate supported on the surface of the supporting die.

Since the vaporized surface treatment agent which has been fed into the treatment chamber is evacuated radially as a laminar flow through the clearance between the cover and supporting die, a laminar flow of the vaporized surface treatment agent is formed along the upper surface of the substrate and a uniform surface treatment can thus be applied to the substrate.

One embodiment of this invention will hereinafter be described with reference to FIGS. 1 and 2.

The supporting die 2 houses unillustrated heating or cooling means, which is additionally provided with an unillustrated temperature sensor.

In the upper surface of the supporting die 2 through which the vacuum suction holes 5 are bored, a pair of parallel grooves 10 are formed so that a corresponding pair of endless belts 9,9', which are adapted to convey the substrate 1, can be selectively lifted to points above the upper surface of the supporting die 2 or lowered to points below the upper surface of the supporting die 2.

In order to effect the selective lifting of the endless belts 9,9' to the points above the upper surface of the supporting die 2 or the selective lowering of the same to the points within the grooves 10, the endless belts 9,9' are connected to horizontally-driving means and lifting means although these means are not shown in the drawings.

Therefore, the substrate 1 placed on the endless belts 9,9' is conveyed horizontally by the endless belts 9,9' and is then lowered onto the supporting die 2.

A frame-like evacuation chamber 8 formed, for example, of a gutter of a rectangular cross-section is provided on the peripheral side wall of the supporting die 2. Forced evacuation ducts which are not illustrated in the drawings are connected to the evacuation chamber 8 at desired points. The upper wall of the evacuation chamber 8 defines slits 8' therethrough. The vaporized surface treatment agent, which has flown out along the upper surface of the supporting die 2, and the room air are drawn through the slits 8' into the evacuation chamber 8, followed by their evacuation to the outside of the room through the unillustrated evacuation ducts.

The evacuation chamber 8 also defines parallel grooves 11, which have the same shape as the parallel grooves 10, in continuation with the parallel grooves 10, whereby the endless belts 9,9' can be lifted to the points above the upper surface of the supporting die 2 and lowered to the points within the grooves 20 without any problem or inconvenience.

Figure 1:
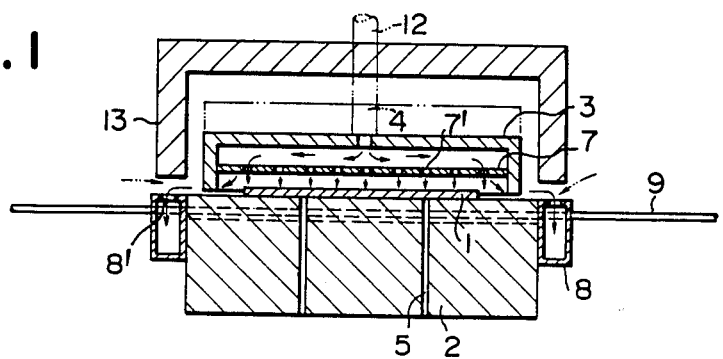
FIG. 1 is a vertical cross-sectional view of a surface treatment apparatus according to one embodiment of this invention.
Figure 2:
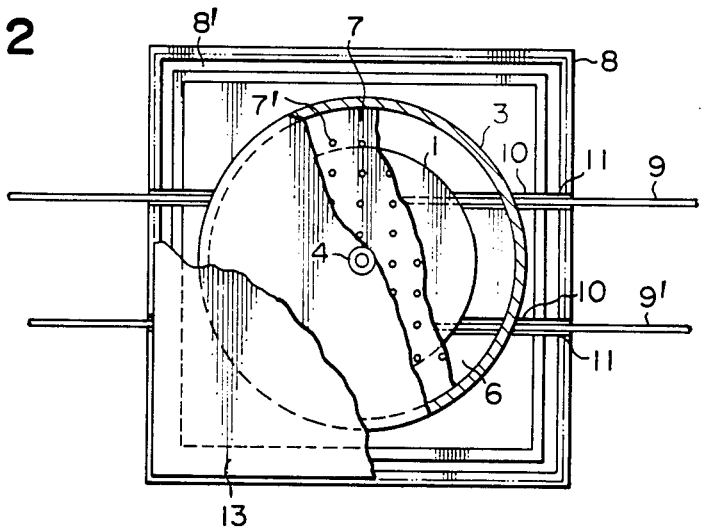
FIG. 2 is a partly cut-away plan view of the surface treatment apparatus of FIG. 1.

The cover 3, which defines a treatment chamber extending over the substrate 1 on the supporting die 2 and opening around the lower periphery thereof, is also provided in such a way that the cover 3 is selectively displaceable up and down by suitable lifting means between a position indicated by two-dot chain lines in FIG. 1 and another position indicated by solid lines in the same figure.

The distance between the lower peripheral edge of the lowered cover 3 and the upper surface of the supporting die 2 is set, for example, at 0.5 mm or so.

Although not illustrated in the drawings, it may be possible to provide, for example, at least one or preferably three spacers on the lower peripheral edge of the cover 3 so that the lower peripheral edge of the cover 3 and the upper surface of the supporting die 2 can be brought into point-to-point contact and the clearance between the lower peripheral edge of the cover 3 and the upper surface of the supporting die 2 can be kept at the same width.

The feed pipe 4, which is adapted to introduce the vaporized surface treatment agent into the treatment chamber, is centrally provided within an upper part of the cover 3. Furthermore, a straightening plate defining a number of perforations 7' therethrough is fixedly secured within the cover 3.

A feed line 12 is connected to the cover 3 for supplying the vaporized surface treatment agent to the treatment agent. The feed line 12 is provided at a desired location thereof with an automatic valve, which is selectively opened to feed the vaporized surface treatment agent.

It is preferable to suspend a heat-insulating housing 13 outside the cover 3 as illustrated in FIG. 1, so that the cover 3 is surrounded by the heat-insulating housing 13.

The operation of the surface treatment apparatus depicted in FIGS. 1 and 2 will next be described.

First of all, the substrate 1 which has been conveyed to a point above the supporting die 2 by means of the endless belts 9,9' is placed on the surface of the supporting die 2 by lowering the belts 9,9' down into the parallel grooves 10.

Thereafter, the substrate is held firmly on the supporting die 2 owing to suction forces produced through the vacuum suction holes 5. By the unillustrated heating or cooling means housed within the supporting die 2, the substrate 1 is either heated or cooled to a prescribed temperature.

The cover 3 is then lowered from the position indicated by two-dot chain lines in FIG. 1 so that the lower peripheral edge of the cover 3 is brought close to the upper surface of the supporting die 2. At the same time, the vaporized surface treatment agent is fed through the feed pipe 4 and is then allowed to flow downwardly through the perforations 7' of the straightening plate 7.

Thus, the vaporized surface treatment agent is brought into contact with the upper surface of the substrate 1.

The vaporized surface treatment agent is then allowed to flow out of the treatment chamber, which lies underneath the cover 3, through the clearance between the cover 3 and supporting die 2 by its own pressure. The vaporized surface treatment agent is thereafter drawn together with the room air through the slits 8' of the evacuation chamber 8 provided on the peripheral side walls of the supporting die 2, followed by its further evacuation to a location outside the room.

After conducting the surface treatment of the substrate 1 for a predetermined time period, the supply of the vaporized surface treatment agent is stopped and the cover 3 is lifted. At the same time, the endless belts 9,9' are also lifted from the parallel grooves 10,10 so that the substrate 1, which has already been released from its vacuum suction, is separated from the supporting die 2 and conveyed horizontally.

Thereafter, a next substrate is conveyed into the treatment chamber and in the same manner as described above, is treated therein. By repeating this operation, a number of substrates can be surface-treated one after another continuously.

Since the evacuation from the evacuation chamber 8 is still continued even when the cover 3 is in the lifted position, it is possible to prevent the treatment gas from escaping from the treatment chamber into the room.

The surface treatment agent is not necessarily limited only to an adhesion-enhancing agent such as organochlorosilane or hexamethyldisilazane. Needless to say, other surface treatment agents can also be employed so long as they can be gasified or vaporized at prescribed temperatures and the resultant gases or vapors can be brought into uniform contact with substrates so as to effect their uniform surface treatments.

In the illustrated embodiment, the cover has a cylindrical shape. It may take the form of a polygonal cylinder. It is of course possible to form the supporting die 2 into a circular shape substantially similar to the shape of the substrate 1 and to construct the evacuation chamber 8 into a ring-like shape correspondingly.

When the straightening plate is provided, the vaporized surface treatment agent is allowed to contact as a substantially uniform laminar flow with the surface of the substrate. It is thus possible to perform a more uniform surface treatment compared with the conventional apparatus.

Owing to the provision of the heat-insulating housing in the suspended fashion to externally surround the cover, the quantity of heat to be dissipated from the cover is reduced compared with the conventional apparatus. This leads to an improved heat efficiency and a more precise temperature control.

Having now fully described the invention, it will be apparent to one of ordinary skill in the art that many changes and modifications can be made thereto without departing from the spirit or scope of the invention as set forth herein.

What is claimed is:

1. In an apparatus for processing a wafer substrate with an adhesion-enhancing agent, said apparatus including a heating or cooling plate having an upper surface for heating or cooling said substrate thereon, conveyer means for conveying said substrate to and from said plate, introducing means for introducing said adhesion-enhancing agent onto said substrate and an insulating housing provided above said plate, the improvement therein comprising:

an inner cover means provided with said housing for defining a processing chamber between said heating or cooling plate and said cover means, said cover means being connected to said introducing means and movable relative to said heating or cooling plate when a substrate is conveyed to and from said heating or cooling plate;

a straightening plate having a plurality of holes over the whole surface thereof and being mounted within said cover means between said introducing means and said plate;

spacer means for defining a space between the upper surface of said heating or cooling plate and the lower peripheral edge of said cover means; and an exhausting chamber provided entirely around said lower peripheral edge of said housing, said chamber having a port which extends entirely around said peripheral edge of said housing, said chamber being connectable to suction means, said adhesion-enhancing agent introduced into the processing chamber through said straightening plate and supplied onto the substrate evenly and uniformly through said holes flows out through said space between said heating or cooling plate and said cover means as a natural flow, and is then drawn through said port into said exhausting chamber by said suction means.

2. A surface treatment apparatus as claimed in claim 1, wherein the cover is equipped with lifting means, whereby the cover is vertically displaceable relative to the supporting plate.

3. A surface treatment apparatus as claimed in claim 1, wherein said plate includes vacuum suction holes therethrough so as to hold the substrate under vacuum on said plate.

4. A surface treatment apparatus as claimed in claim 1, wherein the cover is provided at the lower peripheral edge thereof with 1-3 spacers so that the cover and the supporting die are brought into mutual contact at 1-3 points.

5. A apparatus is claimed in claim 1 wherein said port is spaced away from said space between said plate and said cover means, said port communicating with the ambient atmosphere surrounding said apparatus.

6. An apparatus as claimed in claim 1, wherein said introducing means is connected in a position symmetrical to said cover means and said port is located symmetrically in relation to said introducing means.

7. A surface treatment apparatus comprising: a supporting die for holding a substrate which is to be treated, on the upper surface of said die to heat or cool the substrate; said supporting die having in the upper surface thereof a pair of mutually-parallel grooves with substrate conveyor belts therein and means for moving said belts for allowing said substrate conveyor belts to be selectively lifted to points above the upper surface of the supporting die or lowered to points below the upper surface of the supporting die;

a cover capable of advancing close to the supporting die or into point-to-point contact with the supporting die to define a treatment space over the entire upper surface of the substrate on the supporting die, said cover having a hole therethrough for the introduction of a surface treatment agent into the treatment space; and an evacuation chamber provided on the peripheral side wall of the supporting die, whereby the surface treatment agent is allowed to flow from the treatment space into the evacuation chamber.

8. A surface treatment apparatus comprising:
a supporting die for holding a substrate, which is to be treated, on the upper surface thereof to heat or cool the substrate, said supporting die defining vacuum suction holes therethrough so as to hold the substrate under vacuum on the supporting die, said die having a peripheral side wall;
a cover capable of advancing close to the supporting die or into point-to-point contact with the supporting die to define a treatment space over the entire upper surface of the substrate on the supporting die, said cover defining a hole therethrough for the introduction of a surface treatment agent into the treatment space;
a straightening plate provided underneath the hole through which the surface treatment agent is introduced into the treatment space; and
an evacuation chamber provided on and entirely surrounding the peripheral side wall of the supporting die, whereby the surface treatment agent is allowed to flow from the treatment space into the evacuation chamber.

9. A surface treatment apparatus as claimed in claim 8, wherein the cover is provided with a heat-insulating housing which surrounds the cover.

10. A surface treatment apparatus comprising: a supporting die for holding a substrate, which is to be treated, on the upper surface of said die to heat or cool the substrate, said supporting die including vacuum suction holes therethrough so as to hold the substrate under vacuum on the supporting die, said supporting die further including in the upper surface thereof a pair of mutually-parallel grooves with substrate conveyor belts therein and means for moving said belts for allowing said substrate conveyor belts to be selectively lifted to points above the upper surface of the supporting die or lowered to points below the upper surface of the supporting die;
a cover capable of advancing close to the supporting die or into point-to point contact with the supporting die to define a treatment space over the entire upper surface of the substrate on the supporting die, said cover having a hole therethrough for the introduction of a surface treatment agent into the treatment space;
a straightening plate provided underneath the hole through which the surface treatment agent is introduced into the treatment space; and
an evacuation chamber provided on the peripheral side wall of the supporting die, whereby the surface treatment agent is allowed to flow from the treatment space into the evacuation chamber.

11. A surface treatment apparatus as claimed in claim 8, wherein the cover is provided at the lower peripheral edge thereof with 1-3 spacers so that the cover and the supporting die are brought into mutual contact at 1-3 points.

* * * * *